United States Patent [19]
Sakai

[11] Patent Number: 5,202,575
[45] Date of Patent: Apr. 13, 1993

[54] TFT-DRIVEN IMAGE SENSOR INCLUDING A REDUCED-SIZE CAPACITOR STRUCTURE

[75] Inventor: Kazuhiro Sakai, Kanagawa, Japan

[73] Assignee: Fuji Xerox Co., Ltd., Tokyo, Japan

[21] Appl. No.: 698,151

[22] Filed: May 10, 1991

[30] Foreign Application Priority Data

May 18, 1990 [JP] Japan .................. 2-126975

[51] Int. Cl.$^5$ .......................... H01L 27/14
[52] U.S. Cl. .................. 257/292; 257/294; 257/306; 257/435; 257/443; 250/214.1
[58] Field of Search .......... 357/4, 2, 30 D, 30 G, 357/30 I, 30 K, 30 H; 250/211 R, 211 J, 578.1, 208.1

[56] References Cited

U.S. PATENT DOCUMENTS

| | | | |
|---|---|---|---|
| 4,845,375 | 7/1989 | Tsushima | 357/30 I |
| 5,070,236 | 12/1991 | Miyake | 250/208.1 |
| 5,075,244 | 12/1991 | Sakai et al. | 357/2 |

FOREIGN PATENT DOCUMENTS

| | | | |
|---|---|---|---|
| 59-52872 | 3/1984 | Japan | 357/30 K |
| 61-148870 | 7/1986 | Japan | 357/30 L |
| 63-9358 | 1/1988 | Japan | 357/30 |
| 63-67772 | 3/1988 | Japan | 357/30 |

Primary Examiner—Rolf Hille
Assistant Examiner—Minhloan Tran
Attorney, Agent, or Firm—Finnegan, Henderson, Farabow, Garrett & Dunner

[57] ABSTRACT

An image sensor comprising a photoelectric conversion element which includes a transparent electrode and a thin film transistor switching element which includes a drain electrode, wherein an additional capacitor is formed by extending a part of the drain electrode toward the photoelectric conversion element so that a line from the transparent electrode can be connected to the extended portion of the drain electrode and forming first and second metal layers below and above the extended portion of the drain electrode through insulating layers, respectively. This allows lower and upper additional capacitor portions to be formed between the first metal layer and the extended portion of the drain electrode and between the second metal layer and the extended portion of the drain electrode. Accordingly, the additional capacitor consisting of the lower and upper additional capacitor portions can be made small in surface area and large in capacitance, thereby effectively reducing the influence from field through.

19 Claims, 7 Drawing Sheets

TFT-DRIVEN IMAGE SENSOR INCLUDING A REDUCED-SIZE CAPACITOR STRUCTURE

BACKGROUND OF THE INVENTION

The present invention relates to an image sensor used as a reading unit for facsimile machines or image scanners, and more particularly to an image sensor having additional capacitors for temporarily storing electric charges that are generated at photoelectric conversion elements by photoelectric converting operation, each of such additional capacitors being small in surface area and large in capacitance.

Among conventional image sensors, especially of a contact type, there is a TFT-driven image sensor which employs thin film transistor switching elements (TFTs). In the TFT-driven image sensor, image data such as a document is projected on a one-to-one correspondence basis and the projected image data is converted into electric signals. In this case, the projected image is divided into a multiplicity of pixels (photoelectric conversion elements) and electric charges generated at the respective photoelectric conversion elements are temporarily stored at load capacitors disposed in multilayer interconnections or predetermined blocks using thin film transistor switching elements. Then, the stored electric charges are sequentially read as electric signals at a speed within the range from several hundreds of KHz to several MHz. Such a TFT-driven image sensor can read image data with a single drive IC owing to TFT operation, thereby contributing to reducing the number of drive ICs that drive the image sensor.

As shown by, e.g., an equivalent circuit in FIG. 7, this TFT image sensor includes: a line-like photoelectric conversion element array 11 whose length is substantially the same as the length of a document; an electric charge transfer section 12 consisting of a plurality of thin film transistors $T_{i,j}$ ($i=1$ to N, $j=1$ to n) corresponding to respective photoelectric conversion elements 11' on a one-to-one basis; and multilayer interconnections 13.

The photoelectric conversion element array 11 consists of N blocks of photoelectric conversion elements 11'. Further, n photoelectric conversion elements 11', which constitute each block, can be represented equivalently as a plurality of pairs of photodiodes $PD_{i,j}$ ($i=1$ to N, $j=1$ to n) and parasitic capacitors $CD_{i,j}$ ($i=1$ to N, $j=1$ to n). Each photoelectric conversion element 11' is connected to the drain electrode of each thin film transistor $T_{i,j}$. The source electrode of each thin film transistor $T_{i,j}$ is connected to one of n common signal lines 14 and to one of the load capacitors $CL_i$ ($i=1$ to n) accompanying a respective photoelectric conversion element through the matrix-like multilayer interconnections 13. Further, each common signal line 14 is connected to a drive IC 15.

The gate electrode of each thin film transistor of a given block is commonly connected to a gate pulse generating circuit (not shown) so that the thin film transistors $T_{i,j}$ of the given block can be turned on simultaneously. The photoelectric charge generated at each photoelectric conversion element 11' is temporarily stored at both the parasitic capacitor $CD_{i,j}$ in each photoelectric conversion element and an overlap capacitor existing between the drain and gate of each thin film transistor and subsequently transferred to and stored in a corresponding load capacitor $CL_i$ disposed in the multilayer interconnections 13 of a respective block using a thin film transistor $T_{i,j}$ as an electric charge transfer switch.

Specifically, a gate pulse $\phi G1$ from the gate pulse generating circuit turns on the thin film transistors $T_{1,1}$ to $T_{1,n}$ of a first block, thereby causing the electric charge generated at each photoelectric conversion element 11' and stored at each parasitic capacitor $CD_{i,j}$ and the like in the first block to be transferred to and stored at each respective load capacitor $CL_i$. The electric charge stored at each load capacitor $CL_i$ changes the potential of each corresponding common signal line 14, and each changed potential is received at an output line 16 by sequentially turning on an analog switch $SW_i$ ($i=1$ to n) within the drive IC 15.

Then, the thin film transistors $T_{2,1}$-$T_{2,n}$ to $T_{N,1}$-$T_{N,n}$ of a second to N-th blocks are similarly turned on by gate pulses $\phi G2$ to $\phi Gn$, transferring the electric charges from the photoelectric conversion elements of each block. By sequentially reading the transferred electric charges, image signals equivalent to a single line in a main scanning direction of the document can be obtained. The above operation is repeated in connection with the document moved by document feeding means (not shown) such as rollers, thereby allowing the image signals of the entire document to be obtained (see Japanese Patent Unexamined Publications Nos. Sho. 63-9358 and Sho. 63-67772).

Specific structures of the photoelectric conversion element and TFT for use in the above-described conventional image sensor will be described with reference to FIG. 8 which is a plan view illustrating the photoelectric conversion element and TFT and FIG. 9 which is a sectional view illustrating a portion taken along a line B-B' shown in FIG. 8.

As shown in FIGS. 8 and 9, the conventional photoelectric conversion element is of a sandwiched structure having a belt-like metal electrode 22 made of, e.g., Cr that acts as a lower common electrode, a photoconductive layer 23 made of amorphous silicon hydride (a-Si:H) that is segmented into each photoelectric conversion element 11' (i.e., each bit), and a similarly segmented upper transparent electrode 24 made of indium-tin oxide (ITO) deposited on an insulating substrate 21 made of, e.g., glass or ceramics.

The lower metal electrode 22 is formed so as to extend belt-like in the main scanning direction, and the photoconductive layer 23 is sparsely segmented on the metal electrode 22 while the upper transparent electrode 24 is similarly sparsely segmented so as to form individual electrodes. As a result, a portion interposing the photoconductive layer 23 between the metal electrode 22 and the transparent electrode 24 constitutes a photoelectric conversion element 11', a group of such portions constituting the photoelectric conversion element array 11. A predetermined voltage VB is applied to the metal electrode 22.

An end of a line 30a made of, e.g., Al is connected to an end of each sparsely segmented transparent electrode 24, while the other end of the line 30a is connected to the drain electrode 41 of a corresponding thin film transistor $T_{i,j}$ of the electric charge transfer section 12.

As shown in FIGS. 8 and 9, the TFT for use in the conventional image sensor has a reverse staggered structure. Specifically, the TFT is formed by sequentially depositing, on the substrate 21, a chromium (CrI) layer serving as a gate electrode 25, a silicon nitride (SiNx) film serving as a gate insulating layer 26, an amorphous silicon hydride (a-Si:H) layer serving as a semiconductor activated layer 27, a silicon nitride (SiNx) film serving as a top insulating layer 29 that is arranged so as to confront the gate electrode 25, an n+ amorphous silicon hydride (n+a-Si:H) layer serving as an ohmic contact layer 28, and a chromium (Cr2) layer serving as a drain electrode 41 and a source electrode 42, with additional depositions of a polyimide insulating layer on the Cr2 layer, and of the line layer 30a on the polyimide layer or an Al layer 30 above the top insulating layer 29 to shield the a-Si:H layer.

The Al layer 30 for shielding the a-Si:H layer is provided to prevent light from provoking photoelectric conversion caused by allowing the light to transmit through the top insulating layer 29 and inject into the a-Si:H layer. The line 30a from the transparent electrode 24 in the photoelectric conversion element 11' is connected to the drain electrode 41. The ohmic contact layer 28 is separated into a partial layer 28a that is in contact with the drain electrode 41 and a partial layer 28b that is in contact with the source electrode 42, and the Cr2 layer serving as the drain electrode 41. The source electrode 42 is similarly separated so as to cover the ohmic contact layer portions 28a and 28b. This Cr2 layer serves not only to prevent the Al line layer from being damaged during vacuum evaporation or sputtering but also to maintain the n+a-Si:H property of the ohmic contact layer 28.

However, the constructed photoelectric conversion element and TFT of the conventional image sensor disadvantageously suffer from "field through", a phenomenon such that when a large voltage gate pulse $\phi Gi$ (i=1 to n) is applied from a gate signal line to each gate electrode 25, the potentials in the multilayer interconnections 13 and in the photoelectric conversion elements 11' are instantaneously increased by being pulled up by the gate pulse voltage.

The field through will be described in detail with reference to a circuit diagram shown in FIG. 10.

The circuit shown in FIG. 10 includes a photoelectric conversion element (PD) to which a predetermined bias voltage VB is applied. The photoelectric conversion element (PD) has a parasitic capacitor (CDi,j). A pulsed voltage ($V_{GON} - V_{GOFF}$) is applied to the gate electrode (G) of a thin film transistor (TFT) to turn on and off the gate, while a load capacitor (CL) is formed so as to store an electric charge generated at the photoelectric conversion element (PD) with the TFT as a switch. Potential variations at the load capacitor (CL) are read into a common line (COM).

The thin film transistor (TFT) includes overlap capacitors (CGD) and (CGS) existing between its gate electrode (G) and drain electrode (D) and between its gate electrode (G) and source electrode (S), respectively. Potentials at the drain electrode (D) and source electrode (S) are subjected to a variation called "field through" at the time the gate is turned on and off.

The potential variation ($\Delta$VD) caused by field through at the drain electrode (D) is determined by capacitances as expressed in the following way.

$$\Delta VD = \{CGD/(CGD+CDi,j)\} \times (V_{GON}-V_{GOFF})$$

Further, the potential variation ($\Delta$VS) caused by field through at the source electrode (S) is determined by capacitances as expressed in the following way.

$$\Delta VS = \{CGS/(CGS+CL)\} \times (V_{GON}-V_{GOFF})$$

The potential variation ($\Delta$VS) at the source electrode (S) is not so influential, because the capacitance of the CL is sufficiently large. However, the potential variation ($\Delta$VD) at the drain electrode (D) affects transfer of electric charge because the small capacitance (CDi,j) causes the $\Delta$VD to become larger than the bias voltage VB. This causes current to flow reversely, resulting in incorrect transfer of the electric charge.

Further, the above-described conventional image sensor, in the course of its development for higher resolution and higher density from 300 spi (spot per inch) to 400 spi, must gradually down-size its photoelectric conversion element 11' and TFT. Under such circumstances, smaller parasitic capacitances (CDi,j) would suffer greatly from an instantaneous potential rise caused by field through, which would eventually lead to incorrect transfer of electric charge.

SUMMARY OF THE INVENTION

The present invention has been made in view of the above circumstances. Accordingly, an object of the invention is to provide a high-resolution image sensor capable of reading electric charges correctly by forming an additional capacitor in a photoelectric conversion element and increasing the capacitance of the additional capacitor while reducing the surface area occupied by such an additional capacitor.

To achieve the above object, the invention is applied to an image sensor which comprises a photoelectric conversion element and a thin film transistor switching element. The photoelectric conversion element has a metal electrode, photoconductive layer, and a transparent electrode sequentially deposited, while the thin film transistor switching element has a gate electrode, a source electrode, and a drain electrode. In such an image sensor, an additional capacitor is provided on the side of the photoelectric conversion element by extending c part of the drain electrode toward the photoelectric conversion element so that a line from the transparent electrode can be connected to the extended portion of the drain electrode and by forming first and second metal layers below and above the extended portion of the drain electrode through insulating layers, respectively.

According to the invention, part of the drain electrode in the TFT switching element is extended out toward the photoelectric conversion element so that the line from the transparent electrode in the photoelectric conversion element can be connected to the extended portion of the drain electrode, and the metal layers are arranged both above and below the extended portion of the drain electrode through the insulating layers thereby to form the additional capacitor. Therefore, two capacitor portions can be formed between the upper metal layer and the extended portion of the drain electrode and between the lower metal layer and the extended portion of the drain electrode, and this not only allows the surface area of the additional capacitor to be reduced while increasing its capacitance but also contributes to reducing the influence from the field through.

DETAILED DESCRIPTION OF THE PREFERRED EMBODIMENTS

An embodiment of the invention will be described with reference to the accompanying drawings.

Figure 1:
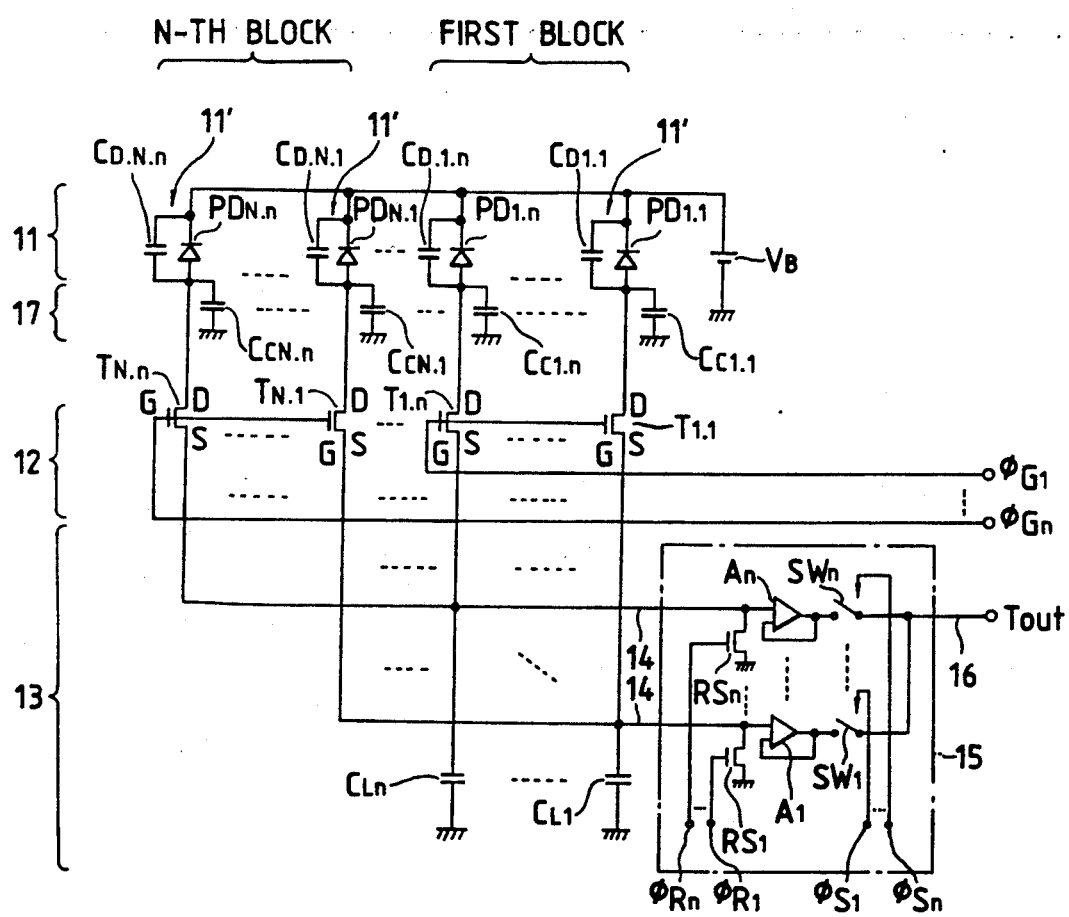
FIG. 1 is an equivalent circuit diagram of an image sensor according to an embodiment of the invention.
Figure 2:
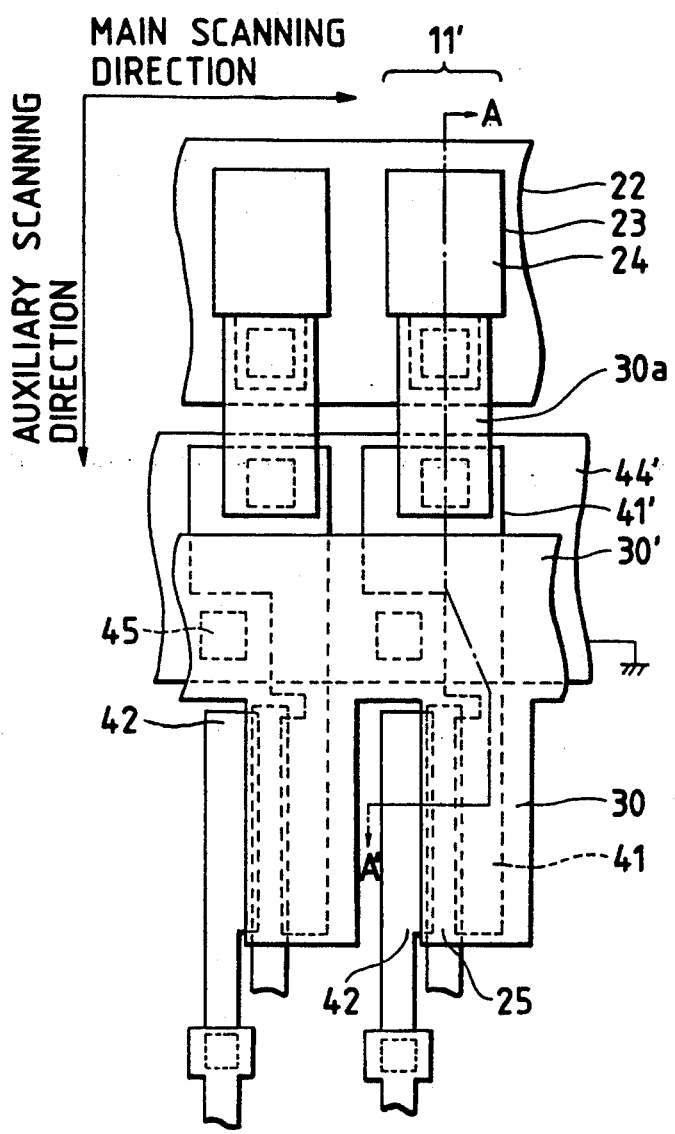
FIG. 2 is a plan view illustrating a photoelectric conversion element, an additional capacitor, and a thin film transistor.
Figure 3:
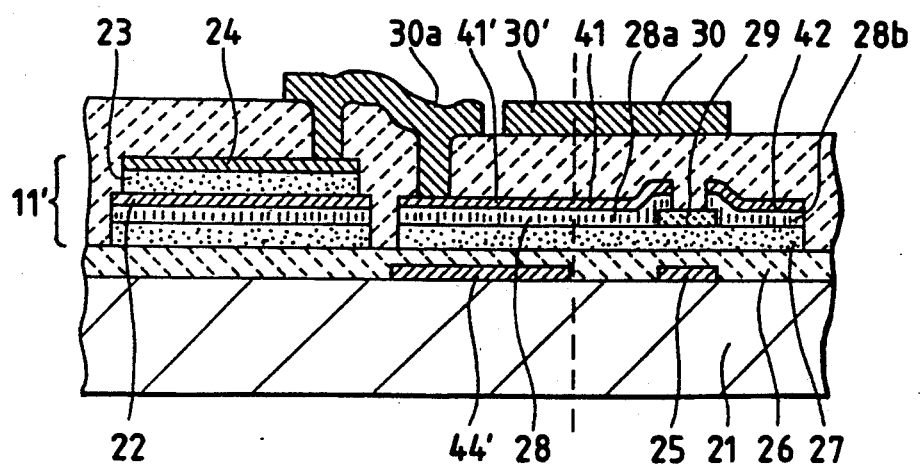
FIG. 3 is a sectional view illustrating a portion taken along a line A-A' shown in FIG. 2.

FIG. 1 is an equivalent circuit diagram of an image sensor according to an embodiment of the invention; FIG. 2 is a plan view illustrating a photoelectric conversion element, an additional capacitor, and a thin film transistor (TFT); and FIG. 3 is a sectional view illustrating a portion taken along a line A-A' shown in FIG. 2. In FIGS. 1 to 3, portions having the same structure as in FIGS. 7 to 10 are designated by the same reference numerals.

As shown in FIG. 1, the image sensor includes: a photoelectric conversion element array 11 (PD1,1 to PDN,n); additional capacitors CCi,j (i=1 to N, J=1 to n); an electric charge transfer section 12 consisting of TFTs (T1,1 to TN,n); matrix-like multilayer interconnections 13; n common signal lines 14; analog switches SW1 to SWn; and load capacitors (CL1 to CLn). The photoelectric conversion element array 11 consists of N blocks of photoelectric conversion elements (photodiodes; PD) 11', each block consisting of n photoelectric conversion elements 11'. The n photoelectric conversion elements 11', each of which has a sandwiched structure, are juxtaposed on an insulating substrate made of, e.g., glass. Each additional capacitor CCi,j is arranged in a respective photoelectric conversion element 11'. An additional capacitor array 17 consists of additional capacitors CCi, j. Each TFT in the charge transfer section 12 is connected to a respective photoelectric conversion element 11' through each a corresponding additional capacitor CCi,j. Each common signal line 14 is connected to a respective photoelectric conversion element in each block from the electric charge transfer section 12 through the multilayer interconnections 13. Each analog switch, arranged within a drive IC 15, is connected to a respective common signal line 14. Each load capacitor CLn is connected to a respective common line 14.

As shown in FIGS. 2 and 3, the photoelectric conversion element 11' is of a sandwiched structure that a belt-like metal electrode 22 made of, e.g., Cr forming a lower common electrode, a photoconductive layer 23 made of amorphous silicon hydride (a-Si:H) that is segmented into each photoelectric conversion element 11' (i.e., each bit), and a similarly segmented upper transparent electrode 24 made of indium-tin oxide (ITO) sequentially deposited on an insulating substrate 21 made of, e.g., glass or ceramics.

The lower metal electrode 22 is formed so as to extend in a belt-like manner in the main scanning direction and the photoconductive layer 23 is sparsely segmented on the metal electrode 22, while the upper transparent electrode 24 is similarly sparsely segmented so as to form individual electrodes. As a result, a portion interposing the photoconductive layer 23 between the metal electrode 22 and the transparent electrode 24 constitutes each photoelectric conversion element 11', a group of such portions constituting the photoelectric conversion element array 11. A predetermined voltage VB is applied to the metal electrode 22.

The photoconductive layer 23 and the transparent electrode 24 are individualized to reduce interference which would be induced by a common layer between adjacent electrodes if the photoconductive layer 23 made of a-Si:H serves as the common layer.

An end of a line 30a made of, e.g., Al is connected to an end of a respective sparsely segmented transparent electrode 24, while the other end of the line 30a is connected to a lead portion 41' extending from the drain electrode 41 in a respective thin film transistor Ti,j of the electric charge transfer section 12.

The photoconductive layer 23 in the photoelectric conversion element 11' may be made of CdSe (cadmium selenide) or the like instead of a-Si:H. The photoconductive layer 23 may also be made of a-Si:H. p-i-n, a-SiC, or a-SiGe. The photoelectric conversion element 11' may be a photoconductor or phototransistor instead of a photodiode as in the above example.

As shown in FIGS. 2 and 3, each additional capacitor (CCi,j) in the photoelectric conversion element 11' includes a first metal layer 44' made of a chromium (Cr1) layer deposited on the substrate 21; the silicon nitride (SiNx) film used as the gate insulating layer 26; the amorphous silicon hydride (a-Si:H) layer used as the semiconductor activated layer 27; the n+ amorphous silicon hydride (n+ a-Si:H) layer used as the ohmic contact layer 28; the lead portion 41' that is made of a chromium Cr2 layer and extended from the drain electrode 41 in the thin film transistor Ti,j of the electric charge transfer section 12; and a second metal layer 30' that is formed by extending part of the Al layer 30 for shielding the a-Si:H layer in the thin film transistor Ti,j through the polyimide insulating layer. Each of these layers or films are deposited one upon the other sequentially on the substrate 21.

The line 30a from the transparent electrode 24 of each photoelectric conversion element 11' is connected to an end of the lead portion 41' extended from the drain electrode 41 in a respective thin film transistor Ti,j so that the line 30a is directly connected from the lead portion 41' to the drain electrode 41 in the respective thin film transistor Ti,j.

Accordingly, a portion interposing the SiNx layer, a-Si:H layer and n+ a-Si:H layer between the lead portion 41' and the first metal layer 44' constitutes a lower additional capacitor portion, while a portion interposing the polyimide insulating layer between the lead portion 41' and the second metal layer 30' constitutes an upper additional capacitor portion. Since the additional capacitor CCi,j in the photoelectric conversion element 11' consists of both the lower and upper additional capacitor portions, the surface area of each additional capacitor CCi,j can be reduced while increasing its capacitance.

Further, the first and second metal layers 44' and 30' are connected to each other through a contact hole 45 to equalize their potentials. The first metal layer 44' is grounded. Since the first metal layer 44' and the second metal layer 30' interpose the lead portion 41', the lead portion 41' can be shielded, and this eventually contributes to preventing crosstalk between each metal layer and the lead portion 41' adjacent to that metal layer.

While the second metal layer 30' is formed by extending part of the Al layer 30 for shielding the a-Si:H layer in the thin film transistor Ti,j so as to cover a drain electrode 41 portion of the thin film transistor Ti,j in the additional capacitor CCi,j portion, it may also be formed separately from the Al layer 30.

As shown in FIGS. 2 and 3, the TFT serving as the electric charge transfer section 12 is a transistor having a reverse staggered structure. The TFT is formed by sequentially depositing, on the substrate 21, the chromium (Cr1) layer serving as a gate electrode 25, the silicon nitride (SiNx) film serving as a gate insulating layer 26, the amorphous silicon hydride (a-Si:H) layer serving as a semiconductor activated layer 27, the silicon nitride (SiNx) film serving as a top insulating layer 29 which is arranged so as to confront the gate electrode 25, the n+ hydride amorphous silicon (n+ a-Si:H) layer serving as an ohmic contact layer 28, and the chromium (Cr2) layer serving as the drain electrode 41 and a source electrode 42, while further depositing on the Cr2 layer a polyimide insulating layer and depositing on the top insulating layer 29 and Al layer 30 and the first metal layer 30' for shielding the a-Si:H layer.

The Al layer 30 for shielding the a-Si:H layer is provided to prevent light from provoking photoelectric conversion caused by allowing the light to transmit the top insulating layer 29 and inject into the a-Si:H layer. The ohmic contact layer 28 is separated into a partial layer 28a that is in contact with the drain electrode 41 and a partial layer 28b that is in contact with the source electrode 42, and the Cr2 layer serving as the drain electrode 41 and the source electrode 42 are similarly separated so as to cover the ohmic contact layer portions 28a and 28b, respectively. This Cr2 layer serves not only to prevent the Al line layer from being damaged during vacuum evaporation or sputtering but also to maintain the n+ a-Si:H property of the ohmic contact layer 28.

The lead portion 41' is extended from the drain electrode 41 and is connected to the line 30a extending from the transparent electrode 24 in the photoelectric conversion element 11', while the source electrode 42 is connected to an Al line 30b to the multilayer interconnections 13. The same advantage may be obtained even if the semiconductor activated layer 27 is made of another material such as polycrystalline silicon.

In this case, if the Al layer 30 is formed so as to be larger than the width of the drain electrode 41 and fully cover the drain electrode 41, then the Al layer 30 can serve as a shield to obviate crosstalk between the drain electrode 41 and the source electrode 42 adjacent to that drain electrode 41.

A method of preparing the photoelectric conversion element 11' portion, the additional capacitor CCi,j portion, and the TFT portion will be described next.

A Cr1 layer which serves as the gate electrode 25 in the TFT and the first metal layer 44' of the additional capacitor CCi,j is deposited on an already inspected and cleaned substrate 21 made of, e.g., glass, to a thickness of about 750 Å at a temperature of about 150° C. by a DC sputtering method.

The Cr1 layer is then subjected to a photolithographic process, and an etching process using a solution in which cerium ammonium nitrate, perchloric acid, and water are mixed, to pattern the gate electrode 25 and the first metal layer 44' and the resist is thereafter separated.

The Cr1 layer thus processed is then subjected to an alkaline cleaning process. Then, to form the gate insulating layer 26, semiconductor activated layer 27, and top insulating layer 29 in the TFT on the Cr1 pattern, an SiNx film, an a-Si:H film, and an SiNx film are continuously deposited to thicknesses of about 3000 Å, about 500 Å, and about 1500 Å, respectively, by a plasma chemical vapor deposition (P-CVD) method while maintaining the vacuum. The continuous deposition process under the vacuum prevents interfacial contamination, thus contributing to stabilizing TFT performance.

The P-CVD conditions for forming the insulating film (b-SiNx) for the gate insulating layer 26 are: substrate temperature of 300° to 400° C.; $SiH_4$ and $NH_3$ pressures of 0.1 to 0.5 Torr; $SiH_4$ flow rate of 10 to 50 sccm; $NH_3$ flow rate of 100 to 300 sccm; and radio frequency (RF) power of 50 to 200 W.

The P-CVD conditions for forming the a-Si:H film for the semiconductor activated layer 27 are: substrate temperature of 200° to 300° C.; $SiH_4$ pressure of 0.1 to 0.5 Torr; $SiH_4$ flow rate of 100 to 300 sccm; and RF power of 50 to 200 W.

The P-CVD conditions for forming the insulating film (t-SiNx) for the top insulating layer 29 are: substrate temperature of 200° to 300° C.; $SiH_4$ and $NH_3$ pressures of 0.1 to 0.5 Torr; $SiH_4$ flow rate of 10 to 50 sccm; $NH_3$ flow rate of 100 to 300 sccm; and RF power of 50 to 200 W.

To pattern the top insulating layer 29 in a form corresponding to the gate electrode 25, a resist is applied to the surface of the gate insulating layer 29. The thus processed top insulating layer 29 is the exposed and developed from the back of the substrate 21 using the gate electrode 25 pattern as a mask and etched using a mixed solution of HF and $NH_4F$, and the resist is thereafter separated.

The Cr1 layer thus far processed is then subjected to a BHF process, and the n+ a-Si:H film serving as the ohmic contact layer 28 is deposited thereon to a thickness of about 1000 Å at about 250° C. by the P-CVD method using a mixed gas of SiH and $PH_3$. Then, a Cr2 layer that serves as the lower metal electrode 22 in the photoelectric conversion element 11', the drain and source electrodes 41 and 42 in the TFT, and the lead portion 41' extended from the drain electrode 41 in the additional capacitor is deposited to a thickness of about 1500 Å by DC magnetron sputtering. Then, an a-Si:H layer which that serves as the photoconductive layer 23 in the photoelectric conversion element 11' is deposited by the P-CVD method to a thickness of about 13000 Å and an ITO layer that serves as the transparent electrode 24 in the photoelectric conversion element 11' is deposited to a thickness of about 600 Å by the DC magnetron sputtering. Alkaline cleaning must precede each deposition.

The P-CVD conditions for preparing the a-Si:H layer for the photoconductive layer 23 are: substrate temperature of 170° to 250° C.; $SiH_4$ pressure of 0.3 to 0.7 Torr;

SiH$_4$ flow rate of 150 to 300 sccm; and RF power of 100 to 200 W.

The DC magnetron sputtering conditions for preparing the ITO layer are: substrate temperature being at room temperature; Ar and O$_2$ pressures of $1.5 \times 10^{-3}$ Torr; Ar flow rate of 100 to 150 sccm, O$_2$ flow rate of 1 to 2 sccm; and DC power of 200 to 400 W.

To form an individual electrode for the transparent electrode 24 in the photoelectric conversion element 11', the ITO layer is subjected to a photolithographic process and then to an etching process for patterning with a solution in which ferric chloride and hydrochloric acid are mixed. The a-Si:H layer for the photoconductive layer 23 is then dry-etched with a mixed gas of CF$_4$ and O$_2$ using the same resist pattern as a mask. The Cr2 layer for the metal electrode 22 serves as a stopper at the time the a-Si:H layer is dry-etched and thus it remains unpatterned. During the dry-etching process, since the a-Si:H layer for the photoconductive layer 23 is side-etched greatly, the ITO layer must be etched again before separating the resist. As a result, the etching process is continued from around the back of the ITO layer, forming the ITO layer that has the same size as that of the a-Si:H layer for the photoconductive layer 23.

Then, the Cr2 layer that serves as the metal electrode 22 in the photoelectric conversion element 11', the Cr2 layer for the drain and source electrodes 41 and 42 in the TFT, and the Cr2 layer for the lead portion 41' in the additional capacitor CCi,j is subjected to a photolithographic process using a photolithographic mask and to an etching process for patterning using a solution in which cerium ammonium nitrate, perchloric acid, and water are mixed, and further to a resist separation process. During the patterning the metal electrode 22, the source and drain electrodes 42 and 41, and the rectangular lead portion 41' extended from the portion of the drain electrode 41 toward the photoelectric conversion element are formed.

When these patterns are etched using a mixed gas of HF$_4$ and O$_2$, a portion at which the Cr2 layer and the SiNx layer are absent is etched, thereby patterning the a-Si:H layer and the n+ a-Si:H layer. Accordingly, the n+ a-Si:H layer and the a-Si:H layer which are formed below the Cr2 layer for the metal electrode 22 in the photoelectric conversion element 11'; the n+ a-Si:H layer and the a-Si:H layer which are formed below the Cr2 for the lead portion 41' in the additional capacitor CCi,j; and the n+ a-Si:H layer portion for the ohmic contact layer 28 in the TFT and the a-Si:H layer for the semiconductor activated layer 27 are etched. Accordingly, the semiconductor activated layer 27 is patterned and; the ohmic contact layer 28 is segmented so as to be patterned into the portion 28a that is in contact with the drain electrode 41 and the portion 28b that is in contact with the source electrode 42.

Then, to pattern the gate insulating layer 26 in the TFT, the b-SiNx layer is subjected to a photolithographic and etching process using a mixed gas of HF$_4$ and O$_2$.

Further, to form an insulating layer so that the entire part of the image sensor can be covered, polyimide is applied to a thickness of about 13000 Å, pre-baked at about 160° C., patterned by the photolithographic and etching process, and rebaked. Accordingly, the contact portion for energizing the metal electrode 22 and the contact portion for connecting the line from the transparent electrode 24 to the additional capacitor CCi,j in the photoelectric conversion element 11'; the contact portion for connecting the line from the transparent electrode 24 to the lead portion 41' and the contact hole 45 portion for connecting between the first and second metal layers 44' and 30' in the additional capacitor CCi,j; and the contact portion for connecting the line from the source electrode 42 to the multilayer interconnections 13 in the TFT are formed. The polyimide and the like remaining in o the contact portions are then subjected to a descumming process using an O$_2$ plasma for complete removal.

Then, Al is deposited to a thickness of about 10000 Å so as to cover the entire part of the image sensor by the DC magnetron sputtering at about 150° C. and subjected to a photolithographic and etching process for patterning using a solution in which hydrofluoric acid, nitric acid, phosphoric acid, and water are mixed, and the resist is thereafter removed. Accordingly, the line portion for energizing the metal electrode 22 and the line 30a portion for connecting from the transparent electrode 24 to the lead portion 41' in the additional capacitors CCi,j of the photoelectric conversion element 11'; the second metal layer 30' in the additional capacitors CCi,j; and the Al layer 30 for shielding the a-Si:H layer and the Al layer for covering the drain electrode 41 in the TFT are formed.

Lastly, polyimide is applied to a thickness of about 3 μm, pre-baked at 125° C., and then patterned by the photolithographic and etching process, and baked at 230° C. for 90 minutes to form a passivation layer (not shown). The thus formed passivation layer is subjected to a descumming process to remove the residual polyimide.

According to the image sensor of the above embodiment, the additional capacitors CCi,j in the photoelectric conversion element 11' are arranged by forming the lead portion 41' to be rectangular while extending part of the drain electrode 41 in the TFT of the electric charge transfer section 12 toward the photoelectric conversion element 11', and by connecting the line 30a extended from the transparent electrode 24 to an end of the lead portion 41', and further by forming the first and second metal layers 44' and 30' above and below this lead portion 41' through the insulating layers, respectively. Therefore, the capacitors can be formed at both positions, i.e., between the lead portion 41' and the first metal layer 44' formed below the lead portion 41' and between the lead portion 41' and the second metal layer 30' formed above the lead portion 41'. This allows the surface area of the additional capacitor portion in the photoelectric conversion element 11' to be small and its capacitance to be large, thereby contributing to downsizing 400-spi high-resolution and high-density image sensors. In addition, the capacitance obtained will be large enough to suppress the instantaneous potential rise caused by the field through, thereby allowing the output electric charge to be read correctly.

While the structure of the additional capacitors CCi,j on the photoelectric conversion element 11' side has been described in the above embodiment, the same structure may also be applied to the capacitor (load capacitor CLi) on the matrix-like multilayer interconnections 13 side.

Figure 4:
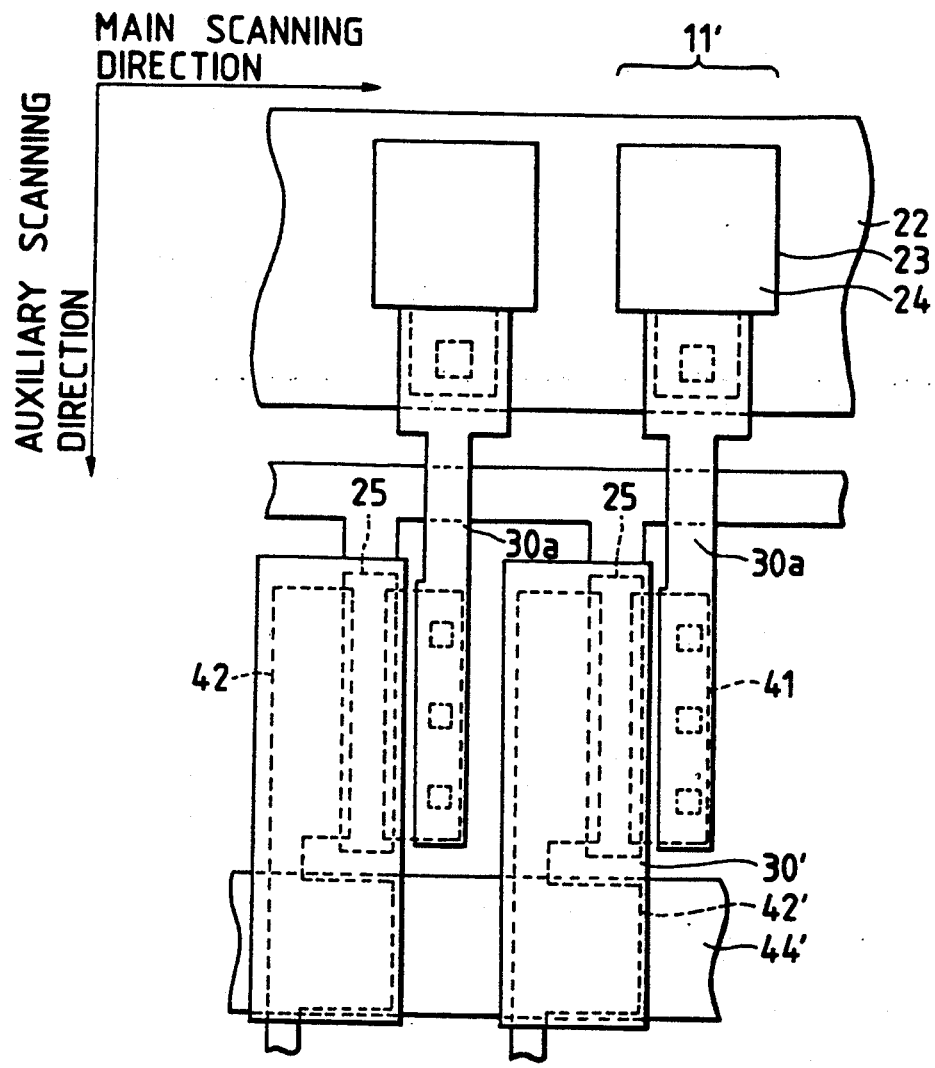
FIG. 4 is a plan view illustrating a photoelectric conversion element, a thin film transistor, and an additional capacitor.

Specifically, as shown in FIG. 4, which is a plan view illustrating the photoelectric conversion element, the thin film transistor, and the load capacitor, the load capacitor CLi on the multilayer interconnections 13 side can be formed by extending a rectangular lead portion 42' from the Cr2 portion of the source electrode 42 in the TFT, while forming the first and second metal layers 44' and 30' below and above the lead portion 42' through the insulating layers, respectively. In this case, the lead portion 42' from the source electrode 42 is directly connected to the multilayer interconnections 13, the first metal layer 44, made of Cr, is formed to be belt-like extending in the main scanning direction and the second metal layer 30' is formed by extending the Al layer 30 for shielding the light injected into the a-Si:H layer in the TFT to thereby cover the lead portion 42' and the source electrode 42. Accordingly, the surface area of each load capacitor CLi in the multilayer interconnections 13 can be reduced, while increasing its capacitance.

Figure 5:
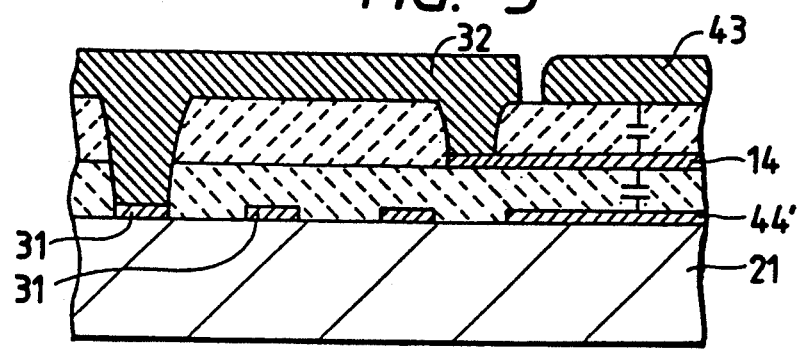
FIG. 5 is a sectional view illustrating multilayer interconnections and an additional capacitor.

Further, another embodiment in which each load capacitor CLi is formed on the multilayer interconnections side will be described with reference to FIG. 5, which is a sectional view illustrating the multilayer interconnections and the load capacitor. As shown in FIG. 5, a rectangular load capacitor CLi is formed as follows. The first metal layer 44' is formed to be belt-like on the substrate 21 simultaneously with lower lines 31, while the upper portion of the metal layer 43 is formed simultaneously with an upper line 32. The upper line 32 is connected to the common signal line 14 through the contact hole, and a portion of the common signal line 14 which is interposed between the upper and lower metal layers is formed to be rectangular. Such a portion constitutes a load capacitor. In this case, the common signal line 14 portion is deposited simultaneously with the Cr2 layer for the drain and source electrodes 41 and 42 in the TFT. Accordingly, the surface area of each load capacitor CLi on the multilayer interconnections 13 side can be reduced, while increasing its capacitance. This eventually contributes to down-sizing the sensor.

Figure 6:
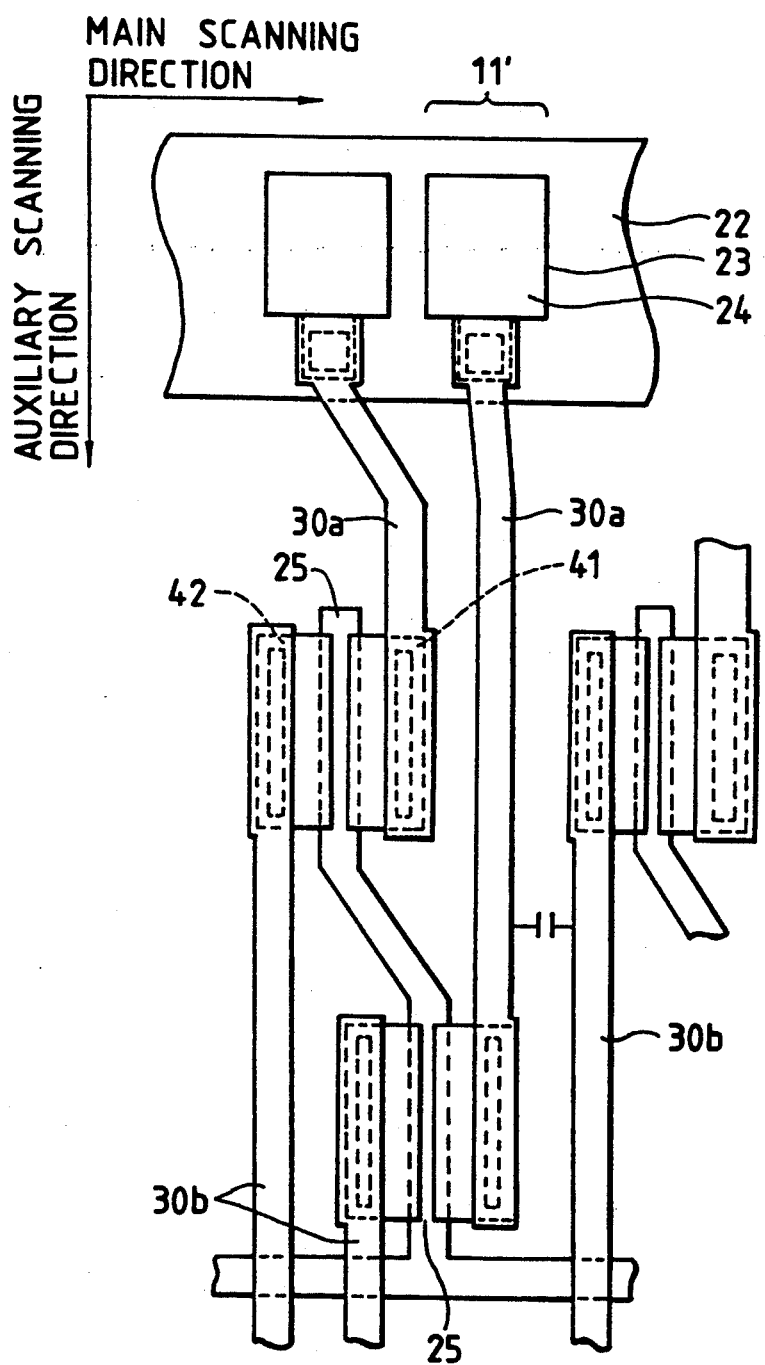
FIG. 6 is a plan view illustrating a conventional photoelectric conversion element and thin film transistor.
Figure 7:
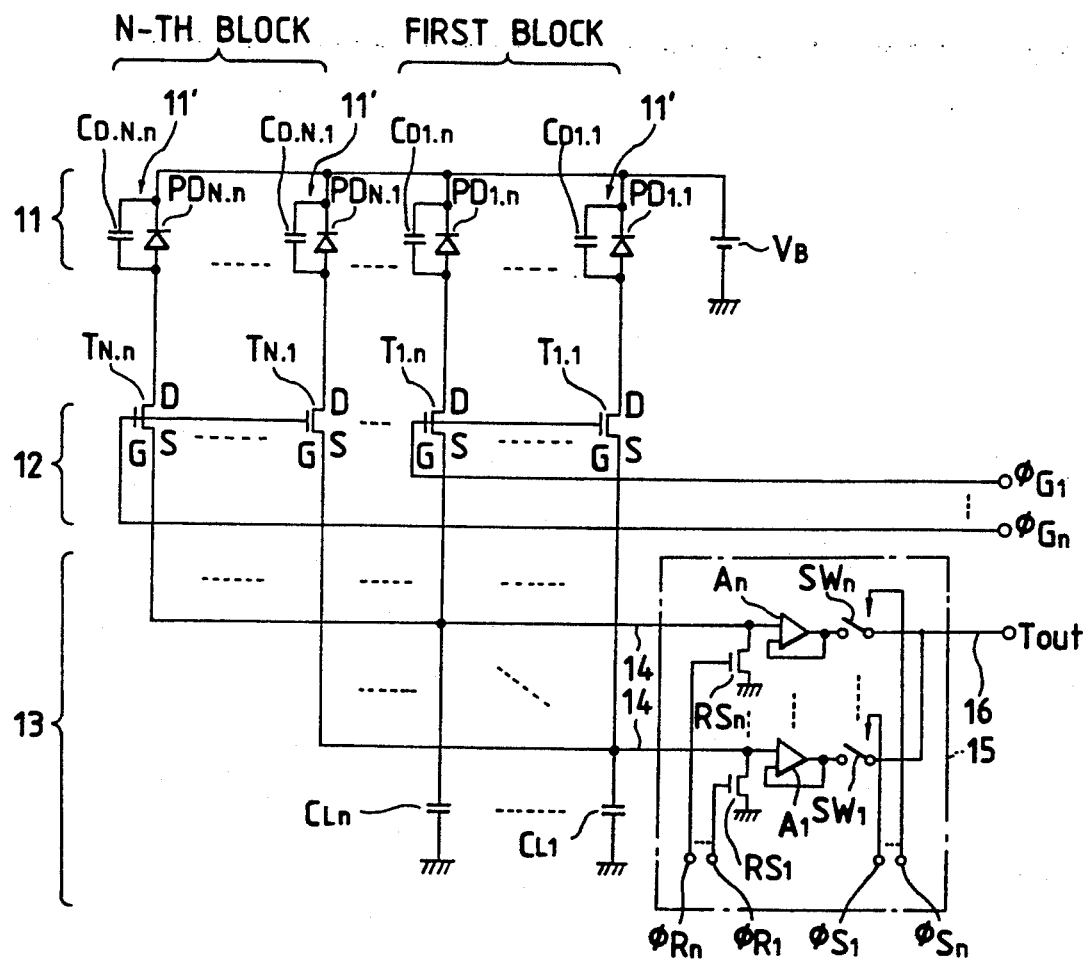
FIG. 7 is an equivalent circuit diagram of a conventional image sensor.
Figure 8:
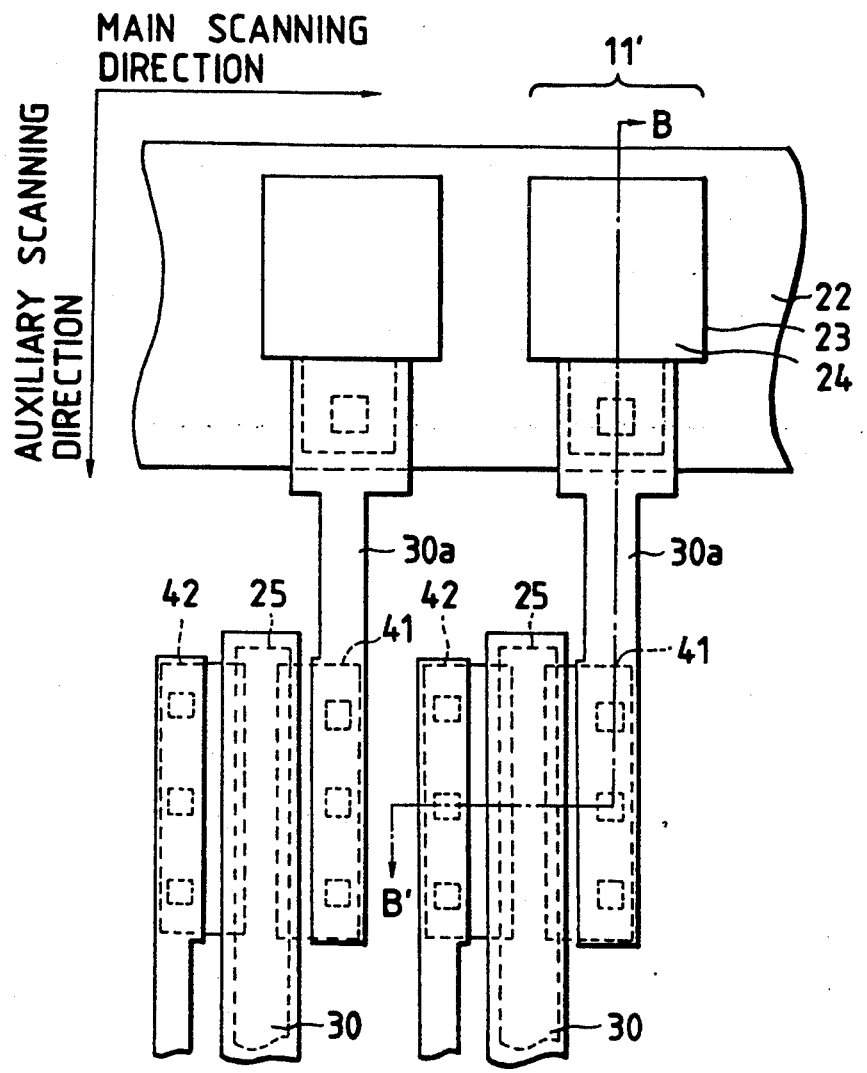
FIG. 8 is a plan view illustrating a conventional photoelectric conversion element and a thin film transistor.
Figure 9:
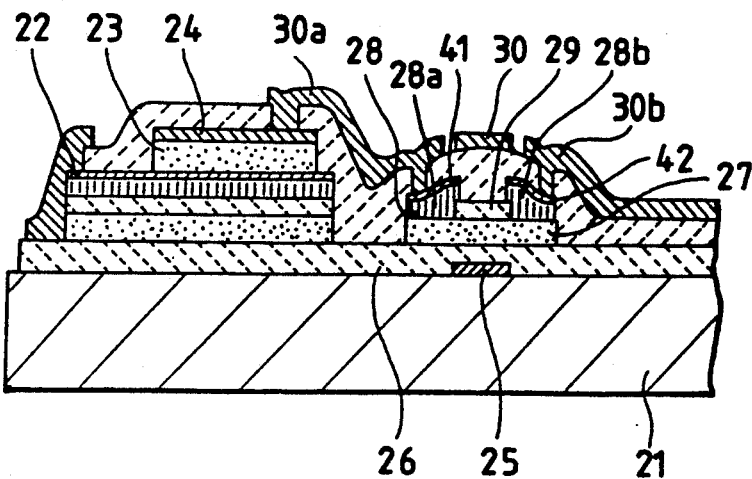
FIG. 9 is a sectional view illustrating a portion taken along a line B—B' shown in FIG. 8.
Figure 10:
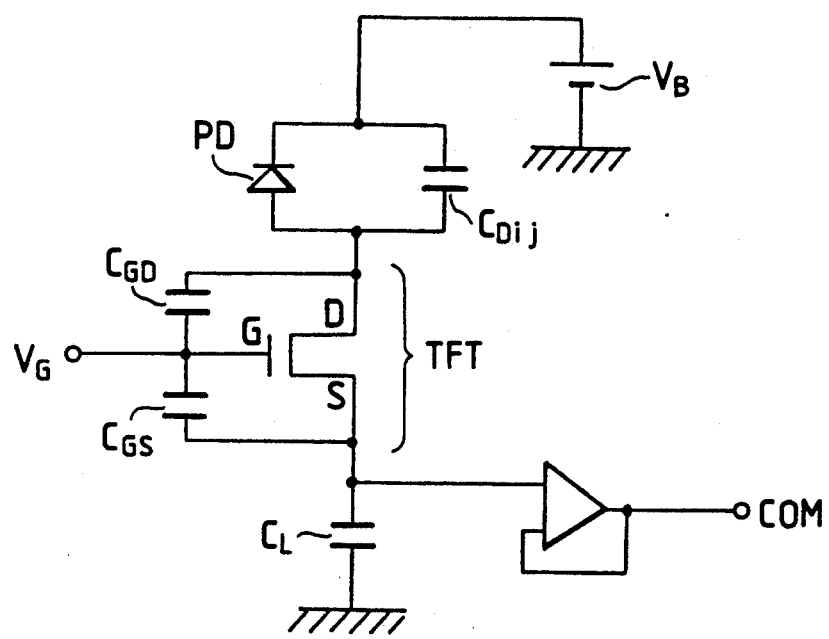
FIG. 10 is a circuit diagram showing a conventional photoelectric conversion element and thin film transistor.

For a higher-density photoelectric conversion element 11' portion, the structure of the invention is distinguished from the conventional structure as follows. The conventional structure is such that the TFTs are alternatively staggered as shown in FIG. 6, which is a plan view illustrating the photoelectric conversion element and the TFT. Instead, the structure of the present invention is such that the lead portion 41' is extended from the drain electrode 41 in the TFT as in the above embodiment and that the line 30a from the transparent electrode 24 in the photoelectric conversion element 11' is connected to an end of the lead portion 41', thereby allowing the size of the TFT portion to be reduced to some degree, which further contributes to down-sizing the device as a whole. In addition, as shown in FIG. 6, the lengths of the lines 30a to the respective drain electrodes in the TFTs from the photoelectric conversion elements 11' are different between adjacent bits. As a result, coupling capacitance is generated between the line 30a to the drain electrode 41 and the line 30b from the source electrode 42 in the TFT, the source electrode 42 being adjacent to the line 30a, thereby making the output signals erratic. However, in the above embodiment, the length of each line 30a to the TFT is uniform, thereby allowing the output signal to be uniform.

According to the invention, the additional capacitors in the photoelectric conversion element are formed by extending a portion of the drain electrode in the TFT switching element toward the photoelectric conversion element so that a line from the transparent electrode of the photoelectric conversion element can be connected to the extended portion of the drain electrode, while forming the metal layers above and below this extended portion of the drain electrode in the TFT through the insulating layers, respectively. This allows the capacitors to be formed between the extended portion of the drain electrode and the metal layer formed above such extended portion and between the extended portion of the drain electrode and the metal layer formed below such extended portion. Therefore, the surface area of each additional capacitor portion in the photoelectric conversion element can be reduced while increasing its capacitance. This eventually allows a high-resolution, high-density sensor to have additional capacitors capable of accommodating field through, thereby providing the advantage of correctly outputting electric charges stored at the additional capacitors and the like.

What is claimed is:

1. An image sensor comprising:
    a photoelectric conversion element formed by sequentially depositing a metal electrode, a photoconductive layer and a transparent electrode;
    a thin film transistor switching element having a gate electrode, a source electrode and a drain electrode, a portion of said drain electrode being extended toward said photoelectric conversion element so that a conductive line from said transparent electrode is connected to said extended portion of said drain electrode; and
    a capacitor having a first metal layer formed below said extended portion of said drain electrode, said first metal layer being separated from said drain electrode by a first insulating layer, and a second metal layer formed above said extended portion of said drain electrode, said second metal layer being separated from said drain electrode by a second insulating layer.

2. An image sensor according to claim 1, wherein said first metal layer is connected to said second metal layer of said capacitor through a contact hole to equalize potentials of said first and second metal layers.

3. An image sensor according to claim 2, wherein said first metal layer is connected to a ground potential.

4. An image sensor according to claim 2, wherein said contact hole extends through said first and second insulating layers.

5. An image sensor according to claim 1, wherein said second metal layer of said capacitor is formed by extending part of a metal layer for shielding said thin film transistor.

6. An image sensor according to claim 1, wherein said first metal layer of said capacitor formed below said extended portion of said drain electrode and separated from said drain electrode by said first insulating layer is further separated from said drain electrode by an ohmic contact layer and a semiconductor activated layer of said thin film transistor.

7. An image sensor according to claim 1, wherein said gate electrode of said thin film transistor and said first metal layer of said capacitor are formed with the same material simultaneously.

8. An image sensor according to claim 7, wherein said same material is chromium.

9. An image sensor according to claim 7, wherein said first metal layer and said gate electrode are formed with the same material simultaneously by depositing said same material on a surface of said image sensor and processing said same material to produce said metal layer and said gate electrode.

10. An image sensor according to claim 9, wherein said same material is chromium.

11. An image sensor according to claim 1, wherein said metal electrode of said photoelectric conversion element, and said drain electrode, and said source electrode of said thin film transistor are formed with the same material simultaneously.

12. An image sensor according to claim 11, wherein said same material is chromium.

13. An image sensor according to claim 11, wherein said metal electrode of said photoelectric conversion element, and said drain electrode and said source electrode of said thin film transistor are formed with the same material simultaneously by depositing said same material on a surface of said image sensor and processing said same material to produce said metal electrode, said drain electrode and said source electrode.

14. An image sensor according to claim 13, wherein said same material is chromium.

15. An image sensor comprising:
 a substrate;
 a photoelectric conversion element formed on said substrate, said photoelectric conversion element including a plurality of sequentially deposited layers, said sequentially deposited layers including respectively a metal electrode, a photoconductive layer and a transparent electrode, said transparent electrode including a conductive line;
 a thin film transistor formed on said substrate, said thin film transistor including a gate electrode, a source electrode and a drain electrode, said drain electrode including an extended portion extending toward said conductive line of said transparent electrode, said extended portion being connected to said conductive line;
 a capacitor formed on said substrate, said capacitor including a first metal layer formed below said drain electrode, said first metal layer being separated from said drain electrode by a first insulating layer, and a second metal layer formed above said drain electrode, said second metal layer being separated from said drain electrode by a second insulating layer.

16. An image sensor according to claim 15, further comprising a contact hole extending through said first and second insulating layers and connecting said first metal layer and said second metal layer to equalize potentials of said first metal layer and said second metal layer.

17. An image sensor according to claim 16, wherein said first metal layer is connected to a ground potential.

18. An image sensor according to claim 15, wherein said second metal layer of said capacitor is formed by extending part of a metal layer for shielding said thin film transistor.

19. An image sensor according to claim 15, wherein said first metal layer of said capacitor is further separated from said drain electrode by an ohmic contact layer and a semiconductor activated layer of said thin film transistor.

* * * * *